US009023247B2

(12) United States Patent
Ohkubo et al.

(10) Patent No.: US 9,023,247 B2
(45) Date of Patent: May 5, 2015

(54) ANTISTATIC TREATMENT AGENT, AND ANTISTATIC FILM, COATED ARTICLE AND PATTERN FORMING METHOD USING THE AGENT

(75) Inventors: Takashi Ohkubo, Chiba (JP); Yoshihiro Saida, Nagano (JP)

(73) Assignee: Showa Denko K.K., Tokyo (JP)

( * ) Notice: Subject to any disclaimer, the term of this patent is extended or adjusted under 35 U.S.C. 154(b) by 1018 days.

(21) Appl. No.: 12/977,693

(22) Filed: Dec. 23, 2010

(65) Prior Publication Data

US 2011/0097671 A1 Apr. 28, 2011

Related U.S. Application Data

(63) Continuation of application No. 11/663,199, filed as application No. PCT/JP2005/017909 on Sep. 21, 2005, now abandoned.

(60) Provisional application No. 60/618,569, filed on Oct. 15, 2004, provisional application No. 60/618,571, filed on Oct. 15, 2004, provisional application No. 60/618,608, filed on Oct. 15, 2004.

(30) Foreign Application Priority Data

Sep. 22, 2004 (JP) ................................ 2004-276069
Sep. 22, 2004 (JP) ................................ 2004-276070
Sep. 22, 2004 (JP) ................................ 2004-276071

(51) Int. Cl.
*H01B 1/00* (2006.01)
*H01B 1/12* (2006.01)
*C09K 3/16* (2006.01)
*G03F 7/09* (2006.01)
*G03F 1/00* (2012.01)
*G03F 7/00* (2006.01)

(52) U.S. Cl.
CPC ............ *C09K 3/16* (2013.01); *C08G 2261/312* (2013.01); *G03F 7/093* (2013.01)

(58) Field of Classification Search
USPC .............. 252/500, 519.21; 430/322; 528/210, 528/214, 377, 378, 403, 422, 380, 391; 428/500; 524/186
See application file for complete search history.

(56) References Cited

U.S. PATENT DOCUMENTS

| 4,640,748 A | 2/1987 | Wudl et al. |
| 5,437,893 A | 8/1995 | Murai et al. |
| 5,482,655 A | 1/1996 | Vogel et al. |
| 5,637,652 A | 6/1997 | Kato et al. |
| 5,760,169 A | 6/1998 | Wudl et al. |
| 5,929,172 A | 7/1999 | Zajaczkowski |
| 5,980,784 A | 11/1999 | Shimizu et al. |
| 6,024,895 A * | 2/2000 | Shimizu et al. ............... 252/500 |
| 6,248,818 B1 | 6/2001 | Kim et al. |
| 6,710,023 B1 | 3/2004 | Bodet et al. |
| 7,094,490 B2 | 8/2006 | Cao et al. |
| 2007/0278458 A1 | 12/2007 | Martello et al. |

FOREIGN PATENT DOCUMENTS

| JP | 4-32848 A | | 2/1992 | |
| JP | 5-171010 A | | 7/1993 | |
| JP | 6-49272 A | | 2/1994 | |
| JP | 6-192440 A | | 7/1994 | |
| JP | 7-48436 A | | 2/1995 | |
| JP | 8-109351 A | | 4/1996 | |
| JP | 8-259673 A | | 10/1996 | |
| JP | 10-110395 A | | 4/1998 | |
| JP | 10-239715 A | | 8/1998 | |
| JP | 11-189746 | * | 7/1999 | ........... C09D 201/00 |
| JP | 11-189746 | | 7/1999 | |
| JP | 2001-281864 A | | 10/2001 | |
| JP | 2002-226721 A | | 8/2002 | |
| JP | 2004-099678 A | | 4/2004 | |

OTHER PUBLICATIONS

Office Action dated Jun. 8, 2010 issue in related U.S. Appl. No. 12/262,495.

* cited by examiner

*Primary Examiner* — Bijan Ahvazi
(74) *Attorney, Agent, or Firm* — Sughrue Mion, PLLC

(57) ABSTRACT

The invention provides an antistatic treatment agent having an ability of preventing resist film thinning phenomenon in a chemically amplified resist, an antistatic film, a coated article and a pattern forming method using such antistatic treatment agent, in particular, the invention provides an antistatic treatment agent comprising an aqueous solvent-soluble electroconductive polymer, a diamine (divalent) or polyamine (polyvalent) aliphatic basic compound and an anionic surfactant, an antistatic film, a coated article and a pattern forming method using such antistatic treatment agent. As the aqueous solvent-soluble electroconductive polymer, a π-conjugated electroconductive polymer having a Brönsted acid group is a sulfonic acid group is preferred and it is preferable that the amount of the diamine (divalent) or polyamine (polyvalent) aliphatic basic compound be from 0.1 to 75 mol % based on the total number of moles of the basic compounds.

16 Claims, No Drawings

ANTISTATIC TREATMENT AGENT, AND ANTISTATIC FILM, COATED ARTICLE AND PATTERN FORMING METHOD USING THE AGENT

CROSS-REFERENCE TO RELATED APPLICATIONS

This application is a Rule 53(b) Continuation of U.S. application Ser. No. 11/663,199 filed Mar. 19, 2007, which is a 371 of PCT/JP2005/017909 filed Sep. 21, 2005 claiming benefit of U.S. provisional application Ser. No. 60/618,569 filed Oct. 15, 2004, U.S. provisional application Ser. No. 60/618,571 filed Oct. 15, 2004 and U.S. provisional application Ser. No. 60/618,608 filed Oct. 15, 2004 under the provision of 35 U.S.C. 111(b), pursuant to 35 U.S.C. Section 119(e)(1), the above-noted applications incorporated herein by reference in their entirety.

TECHNICAL FIELD

The present invention relates to an antistatic treatment agent containing an aqueous solvent-soluble electroconductive polymer and a diamine (divalent) or polyamine (polyvalent) aliphatic basic compound. More specifically, it relates to an antistatic treatment agent, which hardly forms a mixing layer with a chemically amplified resist employed in semiconductor microprocessing process while maintaining its antistatic property. Even more specifically, it relates to an antistatic treatment agent which exhibits an excellent wettability with a chemically amplified resist. Further, the present invention relates to an antistatic film, a coated article and a pattern forming method using the antistatic treatment agent.

BACKGROUND ART

A self-doping type electroconductive polymer is generally soluble in water and has characteristics of being easily formed in an arbitrary shape, formed in a film or positioned, and is therefore characterized with its extremely excellent workability in preparation of a large-area film or in an electrical device requiring microfabrication technology.

A charge-up preventing technology utilizing such characteristics in a lithographic process employing charged particle beams such as electron beams or ion beams is disclosed (JP-A No. 4-32848) and is being widely employed recently.

A chemically amplified resist, which is an essential material in common technology for lithography utilizing light or charged particle beams such as electron beams or ion beams, is a resist which is easily influenced by the use environment and is difficult to handle.

In case of coating a surface of the chemically amplified resist with an electroconductive composition, it is already known that a slight acid component in the coating material can have a significant influence on the sensitivity of the resist. That is, phenomenons that under a certain hydrogen ion concentration (pH) range, acid generated by exposure is neutralized by the coating material and that acid supplied from the coating material makes an unexposed part fall in the same state as an exposed part are observed. Such a phenomenon appears as a film thickness loss in case of a positive type resist, while in case of a negative type resist, such a phenomenon appears as formation of a hardly soluble layer or an insoluble layer.

For suppressing a pH change in an aqueous solution of an aqueous solvent-soluble electroconductive polymer, there is disclosed a method of eliminating oxygen dissolved in the solution (JP-A No. 8-259673) and a method of suppressing a pH decrease by using a buffer solution containing a weak acid and an amine (JP-A No. 11-189746).

Recently there is encountered a problem of resist collapse, caused by reduction in the minimum circuit line width of a semiconductor device, and attempts are being made to select an appropriate aspect ratio in order to avoid such phenomenon, whereby resist film thickness tends to become smaller. A resist patterned through a developing step is subsequently used for a pattern transfer to a substrate by a dry etching step, and dry-etching resistance of the resist in this process is becoming more important, so that requirements for the prevention of a film thickness loss phenomenon of the resist caused by a charge-up preventing film and for the maintenance of a resist profile are becoming stricter in recent years.

More specifically, in a process of forming an antistatic treatment film on a resist surface, in case where a solvent having a high affinity with water contained in the antistatic treatment agent remains in the resist, the liquid components show mutual penetration. As the aqueous solvent-soluble electroconductive polymer also migrates with the penetration of the liquid components, a mixing layer is formed at the interface between the resist and the antistatic treatment film. When the concentration of an acid component derived from the aqueous solvent-soluble electroconductive polymer contained in the mixing layer exceeds the concentration inducing a chemical change of the resist, there is exhibited a film thickness loss phenomenon in case of a positive chemically amplified resist, or formation of a hardly soluble layer or eventually a fogging phenomenon in case of a negative chemically amplified resist. Such an undesired chemical change at the interface generates a profile called a bowing or a T-top in the resist after patterning. In the process of transferring such pattern onto a substrate such as a silicon wafer, the development of such profile detrimentally affects control of variation in the line width and the depth and shape of etching, thus constituting a serious problem in fine patterning.

It is known that since chemical amplification resists are mostly oil-soluble and a coated film thereof is not easily mixed with water, in case of coating a resist surface with an electroconductive composition, a surfactant is added to the electroconductive composition for the purpose of improving a wettability. However conventional surfactants that have been employed often cause an influence on the resist profile such as film thickness loss of the resist, while decrease in the amount of the surfactant reduces the wettability, thus affecting the coating property. On the other hand, since the surfactant also has an influence on the resist, there is disclosed a method of utilizing a water-soluble polymer having a surfactant effect (JP-A. No. 2002-226721).

DISCLOSURE OF INVENTION

An object of the present invention is to provide an antistatic treatment agent having an ability of preventing resist film thinning phenomenon in a chemically amplified resist. Also another object is to provide an antistatic treatment agent having not only an ability of preventing resist film thinning phenomenon but also good coatability. Further, still another object of the present invention is to provide an antistatic film, a coated article and a pattern forming method using such antistatic treatment agent.

The present inventors, as a result of intensive investigations, have found that an antistatic treatment agent containing an aqueous solvent-soluble electroconductive polymer and a diamine (divalent) or polyamine (polyvalent) aliphatic basic compound has an excellent ability for preventing film-thinning in a chemically amplified resist and have thus reached the present invention. The present inventors have further found out that if surfactant is added to the agent, the agent can maintain the ability of preventing film-thinning and exhibits excellent wettability, and have thus completed the present invention.

Thus the present invention relates to a following antistatic treatment agent, a pattern forming method utilizing an antistatic film using the agent, and various substrate products obtained by utilizing the antistatic film and the pattern forming method.

1. An antistatic treatment agent comprising an aqueous solvent-soluble electroconductive polymer having a Brönsted acid group and a diamine (divalent) or polyamine (polyvalent) aliphatic basic compound.
2. The antistatic treatment agent as described in item 1, further comprising a volatile basic compound.
3. The antistatic treatment agent as described in item 1, wherein the molar ratio of diamine (divalent) or polyamine (polyvalent) aliphatic basic compound in the total mole number of the basic compound is within a range of 0.1 to 75 mol. %.
4. The antistatic treatment agent as described in item 1, wherein at least one kind of the diamine (divalent) or polyamine (polyvalent) aliphatic basic compounds has a boiling point of 80° C. or higher.
5. The antistatic treatment agent as described in item 1, wherein the diamine (divalent) or polyamine (polyvalent) aliphatic basic compound consists of one or more kinds selected from a group of a diaminoalkane, a triaminoalkane, a polyaminoalkane and a polyalkylimine.
6. The antistatic treatment agent as described in item 5, wherein the diamine (divalent) or polyamine (polyvalent) aliphatic basic compound consists of one or more kinds selected from a group of ethylenediamine, diaminopropane, diaminobutane, diaminopentane, diaminohexane, diaminooctane, diaminodecane and polyethyleneimine.
7. The antistatic treatment agent as described in item 1, wherein the aqueous solvent-soluble electroconductive polymer is a π-conjugated electroconductive polymer.
8. The antistatic treatment agent as described in item 1, wherein the Brönsted acid group is a sulfonic acid group.
9. The antistatic treatment agent as described in item 1, wherein the number of moles of the basic group contained in the diamine (divalent) or polyamine (polyvalent) aliphatic basic compound is within a range of 0.05 to 50 mol % based on the number of moles of the Brönsted acid group contained in the aqueous solvent-soluble electroconductive polymer.
10. The antistatic treatment agent as described in item 2, which is an aqueous solution containing 0.1 to 10 mass % of an aqueous solvent-soluble electroconductive polymer, 0.1 to 20 mass % of a diamine (divalent) or polyamine (polyvalent) aliphatic basic compound and 0.1 to 20 mass % of a volatile basic compound, provided that the entire amount of the antistatic treatment agent is 100 mass %.
11. The antistatic treatment agent as described in item 1, further comprising a surfactant.
12. The antistatic treatment agent as described in item 11, wherein the surfactant is an anionic surfactant, an amphoteric surfactant or a mixture thereof.
13. The antistatic treatment agent as described in item 11, wherein the surfactant is an anionic surfactant.
14. The antistatic treatment agent as described in item 13, which is an aqueous solution containing 0.1 to 10 mass % of an aqueous solvent-soluble electroconductive polymer, 0.1 to 20 mass % of a diamine (divalent) or polyamine (polyvalent) aliphatic basic compound, 0.1 to 20 mass % of a volatile basic compound and 0.001 to 1 mass % of an amphoteric surfactant provided that the entire amount of the antistatic treatment agent is 100 mass %.
15. The antistatic treatment agent as described in item 1, wherein the aqueous solvent-soluble electroconductive polymer includes a chemical structure represented by formula (1):

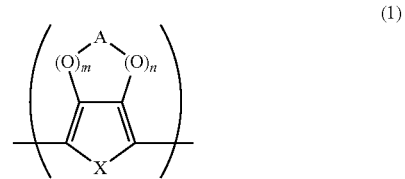

in the formula, m and n each independently represents 0 or 1; X represents S, N—$R^1$ or O; A represents an alkylene group or an alkenylene group (that may have two or more double bonds) having 1 to 4 carbon atoms and having at least a substituent represented by —B—$SO_3^-M^+$, wherein the alkylene and alkenylene group may be substituted with a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group or a substituted phenyl group; B represents —$(CH_2)_p$—$(O)_q$—$(CH_2)_r$— in which p, q and r independently represents 0 or an integer of 1 to 3; and $M^+$ represents a hydrogen ion, an alkali metal ion, or a quaternary ammonium ion.
16. The antistatic treatment agent described in item 1, wherein the aqueous solvent-soluble electroconductive polymer includes a chemical structure represented by formula (2):

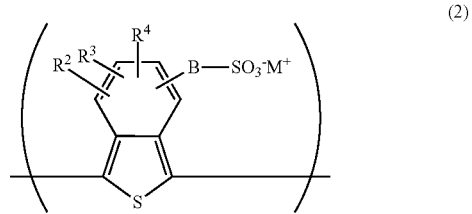

in the formula, $R^2$ to $R^4$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —B—$SO_3^-M^+$ group; and B and M represent the same meanings as described in item 15.
17. The antistatic treatment agent as described in item 1, wherein the aqueous solvent-soluble electroconductive polymer includes a chemical structure represented by formula (3):

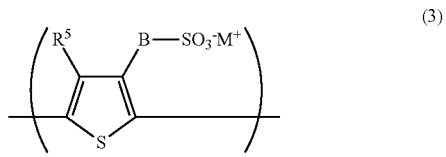

in the formula, $R^5$ represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —B—$SO_3^-M^+$ group; and B, p, q, r and M represent the same meanings as described in item 10.

18. The antistatic treatment agent described in item 1, wherein the aqueous solvent-soluble electroconductive polymer includes a chemical structure represented by formula (4):

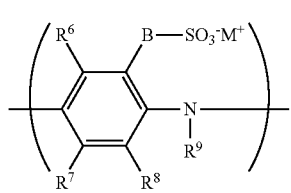

(4)

in the formula, $R^6$ to $R^8$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a $SO_3^-M^+$ group; $R^9$ represents a hydrogen atom or a monovalent group selected from a group of a linear or branched, saturated or unsaturated hydrocarbon group having 1 to 20 carbon atoms, a phenyl group and a substituted phenyl group; and B and M represent the same meanings as described in item 15.

19. The antistatic treatment agent as described in item 15 or 16, wherein the aqueous solvent-soluble electroconductive polymer is a polymer including 5-sulfonisothianaphthene-1,3-diyl as a chemical structure.

20. An antistatic film obtained by using the antistatic treatment agent as described in any one of the items 1 to 19.

21. A coated article coated with the antistatic film as described in item 20.

22. A coated article described in item 21, wherein the antistatic film is formed on a photosensitive composition or a charged particle-sensitive composition coated on a base substrate.

23. The pattern forming method using the antistatic film as described in item 20.

Moreover, the invention relates to a following aqueous solution.

24. An aqueous solution for antistatic treatment agent comprising a diamine (divalent) or polyamine (polyvalent) aliphatic basic compound and an anionic surfactant.

25. An aqueous solution for antistatic treatment agent comprising a diamine (divalent) or polyamine (polyvalent) aliphatic basic compound, a volatile basic compound and an anionic surfactant.

26. The aqueous solution for antistatic treatment agent as described in item 24 or 25, wherein the mole fraction of the diamine (divalent) or polyamine (polyvalent) aliphatic basic compound is within a range of 0.1 to 75 mol % based on the total number of moles of the basic compounds.

27. The aqueous solution for antistatic treatment agent as described in any one of items 24 to 26, comprising at least one kind of the diamine (divalent) or polyamine (polyvalent) aliphatic basic compounds having a boiling point of 80° C. or higher.

28. The aqueous solution for antistatic treatment agent as described in any one of items 24 to 27, wherein the diamine (divalent) or polyamine (polyvalent) aliphatic basic compound consists of one or more kinds selected from a group of a diaminoalkane, a triaminoalkane, a polyaminoalkane and a polyalkylimine.

29. The aqueous solution for antistatic treatment agent as described in any one of items 24 to 27, wherein the diamine (divalent) or polyamine (polyvalent) aliphatic basic compound consists of one or more kinds selected from a group of ethylenediamine, diaminopropane, diaminobutane, diaminopentane, diaminohexane, diaminooctane, diaminodecane and polyethyleneimine.

BEST MODE FOR CARRYING OUT THE INVENTION

The antistatic treatment agent contains an aqueous solvent-soluble electroconductive polymer, and a coating film using the agent and an article coated with the agent having electroconductivity are used for antistatic purpose.

The antistatic treatment agent of the invention, if left standing or dried after an application, loses its water content through evaporation or the like, thereby becoming a semi-solid or a solid without fluidity. The agent in such a state with no fluidity is called "antistatic material", and the antistatic material in a film state is called an "antistatic film". The present invention will be further clarified in the following.

The aqueous solvent-soluble electroconductive polymer is generally a π-conjugated electroconductive polymer having a Brönsted acid group, and is used in a state where a sulfonic acid group or a carboxylic acid group derived from the Brönsted acid group is neutralized with a basic compound. In the present invention, the neutralization is conducted with a mixture consisting of a diamine (divalent) or polyamine (polyvalent) basic compound or another basic compound.

The aqueous solvent-soluble electroconductive polymer, after being coated on a resist surface, forms an ionic bond with a basic compound along with the evaporation of water, but does not lose mobility completely. Also in case of employing a volatile basic compound, when the base substrate is heated together with the resist coated with antistatic film, the ionic bonds formed with the volatile basic compound are partially decomposed to thereby allow the base component to evaporate, thereby resulting in a drawback that a Brönsted acid thus generated affects the resist.

The present inventors have found out that, by neutralizing Brönsted acids in the aqueous solvent-soluble electroconductive polymer with a diamine (divalent) or polyamine (polyvalent) aliphatic basic compound, ionic bonds are formed between the electroconductive polymer and the diamine (divalent) or polyamine (polyvalent) aliphatic basic compound in the antistatic film formed on the surface of the resist film, thereby suppressing mobility of the electroconductive polymer in the antistatic film to thereby prevent mixing at the interface with the chemically amplified resist and that it is effective for suppressing film thickness loss and for maintaining the resist profile.

The diamine (divalent) or polyamine (polyvalent) aliphatic basic compound to be employed in the invention is not particularly restricted, and specific examples include ethylenediamine, 1,3-propanediamine, 1,2-propanediamine, 1,4-butanediamine, 1,5-pentanediamine, 1,6-hexanediamine, 1,2-cyclohexanediamine, 1,8-diaminooctane, 1,10-decanediamine, 2,3-butanediamine, 1,2-bismethylaminoethane, 1,2-bisethylaminoethane, 1,2-bispropylaminoethane, 1,2-bisisopropylaminoethane, 2-dimethylaminoethylamine, ethylaminoethylamine, 2-isopropylaminoethylamine, 2-butylaminoethylamine, 2-propylaminoethylamine, 1,2-bisfurfurylaminoethane, 2-furfurylaminoethylamine, 1,2,3-triaminopropane, 3,3-diaminodipropylamine and polyethyleneimine, but, in case of electron beam drawing, since the resist is generally subjected to heating process, a volatile basic compound shows partial decomposition of the ionic bonds. Therefore, it is preferable that at least a diamine (divalent) or polyamine (polyvalent) aliphatic basic compound having a boiling point of 80° C. or higher be contained. One kind of such diamine (divalent) or polyamine (polyvalent) aliphatic basic compounds may be employed singly or a mixture of two or more kinds may be used. Also it may be used in a mixture with other basic compounds. Preferred examples of other basic compounds include a volatile basic compound. The molar ratio of the diamine (divalent) or polyamine (polyvalent) aliphatic basic compound is preferably 0.01 to 75 mass % based on the entire basic compounds. If the molar ratio is less than 0.01 mass %, an effect of the present invention cannot be obtained. If the ratio exceeds 75 mass %, it may cause decrease in the conductivity and insolubilization of the aqueous solvent-soluble electroconductive polymer, and further, in cases where the agent is applied in a chemically amplified resist, a quenching of acid generated by irradiation of charged particle beams.

A volatile basic compound means a compound that is in a gaseous state under the normal temperature and the normal pressure, having a boiling point of 25° C. or lower, and that is normally handled in a solution state. Specific examples include ammonia, methylamine, ethylamine and dimethylamine.

The chemically amplified resist, after generation of an acid catalyst by exposure to light, is heated to accelerate reaction. In a basic compound having a boiling point equal to or lower than the heating temperature including the following basic compounds, like in a volatile basic compound, ionic bonds between Brönsted acid sites of the electroconductive polymer, the surfactant and the basic compound are partially decomposed to allow the base component to evaporate. Therefore, basic compounds having a boiling point equal to or lower than the normal heating temperature of the resist, such as isopropylamine, ethylmethylamine, t-butylamine, n-propylamine, isopropylmethylamine, cyclopropylamine, diethylamine, allylamine, isobutylamine or ethylpropylamine are included as examples of volatile basic compounds.

The aqueous solvent-soluble electroconductive polymer to be employed in the present invention basically requires to be a π-conjugated electroconductive polymer which has a Brönsted acid group which is soluble in water. The electroconductive polymer is a self-doping type electroconductive polymer where the Brönsted acid group is substituted directly on the main chain of π-electron conjugation or substituted via a spacer such as an alkylene side chain or an oxyalkylene side chain, and the chemical structure is not particularly restricted. Specific examples of the polymer structure include copolymers comprising repeating units such as poly(isothianaphthenesulfonic acid), poly(pyrrolealkylsulfonic acid) and poly (anilinesulfonic acid), polymers having a salt structure thereof and substituted derivatives thereof.

In the aforementioned copolymer, the repeating units having a chemical structure containing a sulfonic acid group normally account for 100 to 50 mol % based on the total repeating units constituting the polymer, preferably 100 to 80 mol %. The polymer may be a copolymer containing repeating units of other π-conjugate chemical structures or have a copolymer composition constituted by 2 to 5 kinds of repeating units.

In the invention, "a copolymer containing a repeating unit" is not necessarily limited to a copolymer containing the repeating unit in continuous manner but includes a polymer containing the repeating unit in irregular manner or discontinuous manner in the π-conjugate main chain such as a random copolymer, as long as a desired electroconductivity can be exhibited based on the π-conjugate main chain.

Examples of particularly useful structures in the aqueous solvent-soluble electroconductive polymer of the invention having the Brönsted acid group include structures represented by formulas (1), (2), (3) and (4). The electroconductive polymer may be a polymer formed by a single structure of each of these general formulas, or a copolymer including such a structure and other structures.

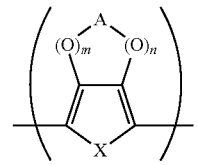

(1)

In the formula, m and n each independently represents 0 or 1; X represents S, N—$R^1$ or O; A represents an alkylene group or an alkenylene group (that may have two or more double bonds) having 1 to 4 carbon atoms and having at least a substituent represented by —B—$SO_3^-M^+$, wherein the alkylene and alkenylene group may be substituted with a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, or a substituted phenyl group; B represents —$(CH_2)_p$—$(O)_q$—$(CH_2)_r$— in which p, q and r independently represents 0 or an integer of 1 to 3; and $M^+$ represents a hydrogen ion, an alkali metal ion, or a quaternary ammonium ion.

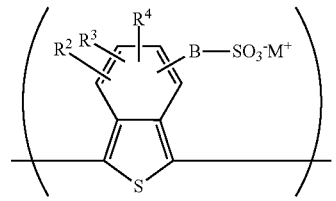

(2)

In the formula, $R^2$ to $R^4$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —B—$SO_3^-M^+$ group. A chain of an alkyl group, an alkoxy group or an alkyl ester group of $R^2$, $R^3$ or $R^4$ may arbitrarily include a carbonyl bond, an ether bond, an ester bond, a sulfonate ester bond, an amide bond, a sulfonamide bond, a sulfide bond, a sulfinyl bond, a sulfonyl bond, or an imino bond. B represents —$(CH_2)_p$—$(O)_q$—$(CH_2)_r$— in which p, q and r independently represents 0 or an integer of 1 to 3; and $M^+$ represents a hydrogen ion, an alkali metal ion, or a quaternary ammonium ion.

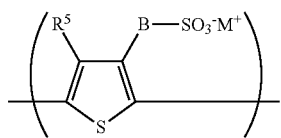

(3)

In the formula, $R^5$ represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —B—$SO_3^-M^+$ group. A chain of the alkyl group, the alkoxy group or the alkyl ester group of $R^5$ may arbitrarily include a carbonyl bond, an ether bond, an ester bond, a sulfonate ester bond, an amide bond, a sulfonamide bond, a sulfide bond, a sulfinyl bond, a sulfonyl bond, or an imino bond. B represents —$(CH_2)_p$—$(O)_q$—$(CH_2)_r$— in which p, q and r independently represents 0 or an integer of 1 to 3; and $M^+$ represents a hydrogen ion, an alkali metal ion or a quaternary ammonium ion.

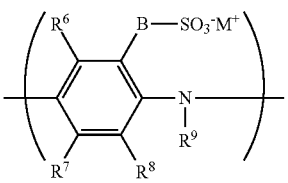

(4)

In the formula, $R^6$ to $R^8$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a $SO_3^-M^+$ group; and $R^9$ represents a hydrogen atom or a monovalent group selected from a group of a linear or branched, saturated or unsaturated hydrocarbon group having 1 to 20 carbon atoms, a phenyl group and a substituted phenyl group. A chain of the alkyl group, the alkoxy group or the alkyl ester group of $R^6$ to $R^8$ may arbitrarily include a carbonyl bond, an ether bond, an ester bond, a sulfonate ester bond, an amide bond, a sulfonamide bond, a sulfide bond, a sulfinyl bond, a sulfonyl bond or an imino bond. B represents —$(CH_2)_p$—$(O)_q$—$(CH_2)_r$— in which p, q and r independently represents 0 or an integer of 1 to 3; and $M^+$ represents a hydrogen ion, an alkali metal ion or a quaternary ammonium ion.

Particularly useful examples for $R^2$ to $R^8$ in the aforementioned formulae include a hydrogen atom, an alkyl group, an alkoxy group, an alkyl ester group, a phenyl or substituted phenyl group, and a sulfonic acid group. More specifically, examples of such substituents include, as an alkyl group, methyl, ethyl, propyl, allyl, isopropyl, butyl, 1-butenyl, pentyl, hexyl, heptyl, octyl, nonyl, decyl, undecyl, dodecyl, tetradecyl, hexadecyl, ethoxyethyl, methoxyethyl, methoxyethoxyethyl, acetonyl and phenathyl; as an alkoxy group, methoxy, ethoxy, propoxy, isopropoxy, butoxy, pentyloxy, hexyloxy, octyloxy, dodecyloxy, methoxyethoxy and methoxyethoxyethoxy; as an alkyl ester group, alkoxycarbonyl groups such as methoxycarbonyl, ethoxycarbonyl and butoxycarbonyl, and acyloxy groups such as acetoxy and butyloyloxy; and as a substituted phenyl group, fluorophenyl, chlorophenyl, bromophenyl, methylphenyl and methoxyphenyl. A chain of the alkyl group or the alkoxy group of $R^2$ to $R^8$ may arbitrarily include a carbonyl bond, an ether bond, an ester bond, a sulfonate ester bond, an amide bond, a sulfonamide bond, a sulfide bond, a sulfinyl bond, a sulfonyl bond, or an imino bond.

Among the aforementioned substituents represented by $R^2$ to $R^5$ in formulas (2) and (3), a hydrogen atom, a linear or branched alkyl or alkoxy group having 1 to 20 carbon atoms are preferred, and a hydrogen atom and a linear or branched alkoxy group having 1 to 20 carbon atoms are particularly preferred.

As a substituent represented by $R^6$ to $R^8$ in formula (4), a hydrogen atom or a monovalent group selected from a group of a linear or branched saturated or unsaturated hydrocarbon group having 1 to 20 carbon atoms, a phenyl group and a substituted phenyl group is preferred.

In formulas (1) to (4), B represents —$(CH_2)_x$—$(O)_y$—$(CH_2)_z$— in which x and z independently represents 0 or an integer of 1 to 3, and y represents 0 or 1; and in case where all of x, y and z are 0 (x=y=z=0), B does not exist and a sulfur atom otherwise to be bonded to B is directly bonded to the bonding site at which B is otherwise to be present.

Preferred examples of B include methylene, ethylene, propylene, butylene, pentylene, hexylene, arylene, butadienylene, oxymethylene, oxyethylene, oxypropylene, methyleneoxyethylene and ethyleneoxyethylene.

In —$(CH_2)_x$—$(O)_y$—$(CH_2)_z$— represented by B, there is particularly desired a case where x and z each independently represents 0 or 1, y represents 0 or 1, and z represents 1 in case where y is 1, and particularly preferable examples of B include a case where B is absent and a sulfur atom is directly bonded (—$SO_3^-M^+$), and a case where B is present and is methylene (—$CH_2$—), dimethylene (—$CH_2$—$CH_2$—), oxymethylene (—O—$CH_2$—), or methyleneoxymethylene (—$CH_2$—O—$CH_2$—).

In the formula, $M^+$ represents a hydrogen ion, an alkali metal ion or a quaternary ammonium ion, and there may be employed a mixture containing one or more of such cations.

The alkali metal ion can be, for example, $Na^+$, $Li^+$ or $K^+$.

The quaternary ammonium ion is represented by $N(R^{10})(R^{11})(R^{12})(R^{13})^+$. In the formula, $R^{10}$ to $R^{13}$ each independently represents a hydrogen atom, a linear or branched substituted or non-substituted alkyl group having 1 to 30 carbon atoms, or a substituted or non-substituted aryl group, or it may also be an alkyl or aryl group including a group containing an element other than carbon or hydrogen, such as an alkoxy group, a hydroxyl group, an oxyalkylene group, a thioalkylene group, an azo group, an azobenzene group or a p-diphenyleneoxy group.

As a quaternary ammonium cation represented by $N(R^{10})(R^{11})(R^{12})(R^{13})^+$, there is employed a non-substituted, alkyl-substituted or aryl-substituted cation such as $NH_4^+$, $NH(CH_3)_3^+$, $NH(C_6H_5)_3^+$, $N(CH_3)_2(CH_2OH)(CH_2$—$Z)^+$, wherein Z represents an arbitrary substituent with a chemical formula amount of 600 or less, such as a phenoxy group, a p-diophenyleneoxy group, a p-alkoxydiphenyleneoxy group or a p-alkoxyphenylazophenoxy group. Also for the purpose of converting to a specified cation, an ordinary ion exchange resin may be used.

The following are examples usable as a constituent unit containing a Brönsted acid and constituting the aqueous solvent-soluble electroconductive polymer of the present invention. Examples not corresponding to formulas (1), (2), (3) and (4) include poly(carbazole-N-alkanesulfonic acid), poly (phenylene-oxyalkanesulfonic acid), poly(phenylenevinylene-alkanesulfonic acid), poly(phenylenevinylene-oxyalkanesulfonic acid), poly(aniline-N-alkanesulfonic acid), poly(thiophenealkylcarboxylic acid), poly(thiopheneoxyalkylcarboxylic acid), poly(polypyrrolealkylcarboxylic acid), poly(pyrroleoxyalkylcarboxylic acid), poly(carbazole-N-alkylcarboxylic acid), poly(phenylene-oxyalkylcarboxylic acid), poly(phenylenevinylene-alkylcarboxylic acid), poly(phenylenevinylene-oxyalkylcarboxylic acid), poly(aniline-N-alkylcarboxylic acid) and a substituted derivative thereof, 6-sulfonaphtho[2,3-c]thiophene-1,3-diyl and a lithium salt, a sodium salt, an ammonium salt, a methylammonium salt, an ethylammonium salt, a dimethylammonium salt, a diethylammonium salt, a trimethylammonium salt, a triethylammonium salt, a tetramethylammonium salt and a tetraethylammonium salt thereof.

Preferred specific examples of the chemical structure represented by formula (1), (2) or (3) include
5-(3'-propanesulfo)-4,7-dioxycyclohexa[2,3-c]thiophene-1,3-diyl,
5-(2'-ethanesulfo)-4,7-dioxycyclohexa[2,3-c]thiophene-1,3-diyl,
5-sulfoisothianaphthene-1,3-diyl,
4-sulfoisothianaphthene-1,3-diyl,
4-methyl-5-sulfoisothianaphthene-1,3-diyl,
6-methyl-5-sulfoisothianaphthene-1,3-diyl,
6-methyl-4-sulfoisothianaphthene-1,3-diyl,
5-methyl-4-sulfoisothianaphthene-1,3-diyl,
6-ethyl-5-sulfoisothianaphthene-1,3-diyl,
6-propyl-5-sulfoisothianaphthene-1,3-diyl,
6-butyl-5-sulfoisothianaphthene-1,3-diyl,
6-hexyl-5-sulfoisothianaphthene-1,3-diyl,
6-decyl-5-sulfoisothianaphthene-1,3-diyl,
6-methoxy-5-sulfoisothianaphthene-1,3-diyl,
6-ethoxy-5-sulfoisothianaphthene-1,3-diyl,
6-chloro-5-sulfoisothianaphthene-1,3-diyl,
6-bromo-5-sulfoisothianaphthene-1,3-diyl,
6-trifluoromethyl-5-sulfoisothianaphthene-1,3-diyl,
5-(sulfomethane)isothianaphthene-1,3-diyl,
5-(2'-sulfoethane)isothianaphthene-1,3-diyl,
5-(2'-sulfoethoxy)isothianaphthene-1,3-diyl,
5-(2'-(2"-sulfoethoxy)methane)isothianaphthene-1,3-diyl,
5-(2'-(2"-sulfoethoxy)ethane)isothianaphthene-1,3-diyl and a lithium salt, a sodium salt, an ammonium salt, a methylammonium salt, an ethylammonium salt, a dimethylammonium salt, a diethylammonium salt, a trimethylammonium salt, a triethylammonium salt, a tetramethylammonium salt and a tetraethylammonium salt thereof.

Preferred specific examples of the chemical structure represented by formula (4) include 2-sulfo-1,4-iminophenylene, 3-methyl-2-sulfo-1,4-iminophenylene, 5-methyl-2-sulfo-1,4-iminophenylene, 6-methyl-2-sulfo-1,4-iminophenylene, 5-ethyl-2-sulfo-1,4-iminophenylene, 5-hexyl-2-sulfo-1,4-iminophenylene, 3-methoxy-2-sulfo-1,4-iminophenylene, 5-methoxy-2-sulfo-1,4-iminophenylene, 6-methoxy-2-sulfo-1,4-iminophenylene, 5-ethoxy-2-sulfo-1,4-iminophenylene, 2-sulfo-N-methyl-1,4-iminophenylene and 2-sulfo-N-ethyl-1,4-iminophenylene and a lithium salt, a sodium salt, an ammonium salt, a methylammonium salt, an ethylammonium salt, a dimethylammonium salt, a diethylammonium salt, a trimethylammonium salt, a triethylammonium salt, a tetramethylammonium salt and a tetraethylammonium salt thereof.

Since the molecular weight of the self-doping type electroconductive polymer to be employed in the present invention depends on a chemical structure of the repeating unit constituting the polymer, it cannot be flatly defined. However, the polymer may have any molecular weight as far as the polymer meets the objects of the present invention, and polymers having the number of repeating unit constituting the main chain (polymerization degree) within a range of 5 to 2,000 and preferably 10 to 1,000 can be mentioned.

Particularly preferred examples of the π-conjugated electroconductive polymer having Brönsted acid group to be employed in the invention include a polymer of 5-sulfoisothanaphthene-1,3-diyl, a random copolymer containing 80 mol % or more of 5-sulfoisothanaphthene-1,3-diyl, poly(5-sulfoisothanaphthene-1,3-diyl-co-isothanaphthene-1,3-diyl), poly(3-(3-thienyl)ethanesulfonic acid)), poly(3-(3-thienyl) propanesulfonic acid)), poly(2-(3-thienyl)oxyethanesulfonic acid)), a random copolymer containing 50 mol % or more of 2-sulfo-1,4-iminophenylene, and poly(2-sulfo-1,4-iminophenylene-co-1,4-iminophenylene), and a lithium salt, a sodium salt, an ammonium salt and a triethylammonium salt thereof.

The concentration of the aqueous solvent-soluble electroconductive polymer differs depending on function desired in the film. However, the concentration is normally from 0.001 to 30 mass % and preferably 0.01 to 10 mass %.

In the antistatic treatment agent of the invention, a solvent miscible with water and not causing a dedoping of the aqueous solvent-soluble electroconductive polymer may be employed. Specific examples include ethers such as 1,4-dioxane and tetrahydrofuran, carbonates such as dimethyl carbonate, diethyl carbonate, ethylene carbonate and propylene carbonate, nitriles such as acetonitrile and benzonitrile, alcohols such as methanol, ethanol, propanol, and isopropanol, non-protonic polar solvents such as N,N-dimethylformamide, dimethylsulfoxide and N-methyl-2-pyrrolidone, mineral acids such as sulfuric acid and organic acids such as acetic acid. These may be employed as a mixed solvent of two or more kinds.

In the antistatic treatment agent of the present invention, an appropriate amount of surfactant may be added for the purpose of improving wettability and coatability. In particular, it is preferable to use a surfactant in a case where the antistatic treatment agent is applied onto a coating film of a resist having low compatibility with water.

The surfactant employed in the present invention is not particularly restricted and any one of anionic, cationic amphoteric and nonionic surfactants may be used. Preferred among them are anionic surfactant and amphoteric surfactant.

It is known that, in a case where anionic surfactant or amphoteric surfactant is used, if the surfactant contains a Brönsted acid in its molecule, it affects a chemically amplified resist.

In the present invention, Brönsted acids present in anionic surfactant and/or amphoteric surfactant, together with Brönsted acids present in the aqueous solvent-soluble electroconductive polymer, are neutralized by a diamine (divalent) or polyamine (polyvalent) aliphatic basic compound, and thereby
crosslinking-like ionic bonds are formed between arbitrary Brönsted acid sites of the electroconductive polymer and the anionic surfactant and the basic compound. As a result, the mobility of the electroconductive polymer and the surfactant can be suppressed to thereby exhibit an effect of preventing film thinning and also to exhibit an unprecededly excellent wettability.

Specific examples of the anionic surfactant employed in the present invention include an alkyl ethersulfonic acid, a linear alkylbenzenesulfonic acid, an α-olefinsulfonic acid, an alkane sulfonate, a dialkylsulfosuccinic acid, a naphthalenesulfonic acid-formaldehyde condensate, an ester of alkylsulfuric acid, an ester of polyoxyethylene alkyl ether sulfuric acid, an ester of polyoxyethylene alkylphenyl ether sulfuric acid, a higher alcohol phosphate ester, a higher alcohol-ethylene oxide adduct phosphate ester, and an acyl-N-methyltaurine.

Specific examples of the amphoteric surfactant employed in the present invention include quaternary ammonium type surfactants such as monoalkylammonium, dialkylammonim and ethoxylated ammonium, alkyl amines, and guanidine group-containing compounds such as lauroylamide guanidine, and also salts thereof may be used.

One of these anionic or amphoteric surfactants can be employed singly or a mixture of two or more kinds may be employed, and also these may be used in combination with a compound having a surfactant effect such as a nonionic or cationic surfactant or a water-soluble polymer.

The amount of the anionic surfactant to be added to the antistatic treatment agent of the present invention is preferably from 0.001 to 1 mass %, based on the entire antistatic treatment agent as 100 mass %. If the blending amount is 0.001 mass % or more, the effect of the invention can be obtained. If the blending amount is 1 or less, the resist profile such as film thickness is not affected. The same is true in a case of using an amphoteric surfactant and the same effect can be obtained.

The antistatic treatment agent of the present invention may be used for a non-chemically amplified resist or for a chemically amplified resist.

For a non-chemically amplified resist, the antistatic treatment agent of the present invention is effective as an antistatic treatment agent with an excellent coating property. A resin in the non-chemically amplified resist is not particularly restricted. Examples thereof include phenolic resins such as novolac resin, poly(methyl methacrylate) resin, acrylic resins such as polyacrylate resin, and a copolymer of α-methylstyrene and α-chloroacrylic acid, however, are not restricted thereto.

For a chemically amplified resist, the present invention prevents formation of a mixing layer at a contact surface between the antistatic film of the invention and the chemically amplified resist, and exhibits an effect of suppressing film thinning in case of a positive type resist, and exhibits an effect of preventing fogging in case of a negative type resist, and. Examples of components in a composition of a chemically amplified resist include a photosensitive resin based on phenolic resin, acrylic resin or azide compound, or a charged particle beam-sensitive resin based on polymethacrylate resin, polyvinylphenol, polyhydroxystyrene or copolymer of α-methylstyrene and α-chloroacrylic acid, and solvents. Also, as additives, examples include a photosensitizer, azide compound, crosslinking agent, dissolution inhibitor and acid generator. Compounds where these additives are introduced in the main chain or side chain of the polymer may be employed, however the components are not limited thereto. Specifically, the compound described as an electron-beam resist composition in JP-A 2001-281864.

The antistatic treatment agent of the present invention can be regulated to an arbitrary pH value from acidic to alkaline state, by varying an addition amount of an amine used for neutralizing the Brönsted acid of the aqueous solvent-soluble electroconductive polymer and the anionic surfactant contained in the solution.

In the present invention, the number of moles of the basic group contained in the diamine (divalent) or polyamine (polyvalent) aliphatic basic compound preferably is from 0.05 to 50 mol % by molar ratio, based on the number of moles of the Brönsted acid group of the aqueous solvent-soluble electroconductive polymer. If the number of moles is less than 0.05, an effect of the present invention cannot be obtained. If it exceeds 50 mol %, it may cause reduction in the conductivity and insolubilization of the aqueous solvent-soluble electroconductive polymer.

As examples of method of forming an antistatic film on the resist surface with the antistatic treatment agent, a spin coating is principally employed, however various methods can be employed according to the purpose of use, such as a dipping (immersion), spraying onto an article, ink jet method, screen printing and bar coating method. For the purpose of coating the antistatic treatment agent of the invention on a resist surface with uniform thickness, spin coating is particularly preferred.

An article coated with the antistatic film of the present invention is a substrate on which an antistatic film and a resist are laminated, and examples of materials for the substrate include silicon wafer, compound semiconductor wafers such as gallium arsenide wafer and indium phosphide wafer, quartz and magnetic material, however, are not limited thereto. As such a laminated substrate, substrates in a transitory state in electron beam lithography including semiconductor manufacturing process or manufacturing process of photomask, reticle or stencil mask are included.

Coating the surface with the antistatic film suppresses changes in the resist profile, such as fogging, film thinning, T-top formation or bowing and thereby enables precise pattern formation. Also, the effect of preventing charge-up of the antistatic film can prevent misregistration in lithographic process using charged particle beams, thereby enables pattern formation with higher precision.

The present invention is applicable also to an electronic device. The electronic device used here means an electronic device having an antistatic film of the invention between electrodes, and can for example be an organic light-emitting device.

Between the electrodes, there may be contained materials other than the antistatic film of the present invention, and there may be provided a laminate structure of an antistatic thin film and thin films of other materials.

EXAMPLES

In the following, the present invention will be explained by Examples and Comparative Examples, but the present invention is not limited thereto.

The synthesizing method of the aqueous solvent-soluble electroconductive polymer compound and instruments and methods employed for measuring various physical properties in the following examples are as follows.
1) Synthesis of aqueous solvent-soluble electroconductive polymer compound
Poly(5-sulfoisothianaphthene-1,3-diyl) as the aqueous solvent-soluble electroconductive polymer compound was synthesized by referring to a method disclosed in JP-A No. 7-48436.
2) pH measurement
The pH values of aqueous solutions were measured with a hydrogen ion concentration meter of glass electrode type (pH METER F-13, manufactured by Horiba Ltd.)
3) Method of preparation of a coated film of the antistatic treatment agent and measurement of surface resistance
With Spinner 1H-III (manufactured by Kyoei Semiconductor Co. Ltd.), a coated film of antistatic treatment agent was prepared by dropping 2 ml of a composition of an antistatic treatment agent on a Corning #1737 glass plate of 60 mm×60 mm×1.1 mm and then spin-coating at 1500 rpm.

The surface resistance of the coated film was measured with a surface resistance measuring device MEGARESTER MODEL HT-301 (manufactured by SHISHIDO ELECTRO-STATICS, LTD.). The upper limit of measurement for this device was $1 \times 10^{11}$ ohm/sq.

4) Contact angle

The contact angle was measured with FACE CA-D manufactured by Kyowa Hyomen Kagaku Co. LTD.

5) Film thickness loss of chemical amplification electron beam resist (hereinafter abbreviated as "resist")

Film thickness loss amount of a resist was evaluated in the following procedure.

(1) Resist film formation: On a square silicon wafer of 40 mm×40 mm, a chemically amplified resist FEP171, manufactured by Fujifilm Arch Co. Ltd., was spin-coated for 60 seconds at 800 rpm, and then a solvent was eliminated by prebaking at 120° C. for 90 seconds.

(2) Measurement of resist film thickness

Resist formed on the substrate was partially peeled off from a part of the substrate surface, and then with the surface part as reference position, the initial resist film thickness A (nm) was measured by using a stylus-type surface profiler (Dektak-3030, manufactured by ULVAC Corp.).

(3) Formation of antistatic film

On the surface coated with resist, 5 ml of an electroconductive composition was dropped so as to cover the entire surface of the substrate, and was spin-coated with a spin coater at 800 rpm for 60 seconds to obtain an antistatic film of a thickness of 0.02 μm.

(4) Baking process

The substrate having the antistatic film and the resist laminated thereon was heated, in an air atmosphere, for 90 seconds on a hot plate in a reflow oven (manufactured by Sikama International Inc.) by regulating the plate surface temperature at 120° C. under actual measurement with a surface temperature meter. Then the substrate of this state was let to stand for 30 minutes in the air at the normal temperature.

(5) Development 2 ml of a developing solution of 2.38 mass % aqueous solution of tetramethyl ammonium hydroxide (TMAH) was dropped on the surface of the antistatic film. After standing for 60 seconds, the developing solution was shaken off at 800 rpm, and the film was dried by continuing the rotation for 60 seconds.

(6) Postbaking process

The substrate was let to stand for 10 minutes in an oven heated in advance to 90° C., for drying.

(7) Resist film thickness B (nm) after development was measured with a stylus-type surface profiler, with respect to the part from which the resist had been peeled off in (2) above.

(8) Resist film thickness loss C (C=A−B) was calculated by subtracting B from A.

6) Reference film thickness loss

A resist has a film thickness loss (hereinafter called reference film thickness loss) D (nm) inherent to each resist, depending on a storage period of the coated film, after the preparation of the resist coated film. Such film thickness loss D, which is not attributable to the antistatic film, was measured in advance by the following method.

(1) Resist film formation

On a square silicon wafer of 40 mm×40 mm, a chemically amplified resist FEP171, manufactured by Fujifilm Arch Co., Ltd, was spin-coated for 60 seconds at 800 rpm, and then a solvent was eliminated by prebaking at 120° C.

(2) Measurement of resist film thickness

Resist formed on the substrate was partially peeled off from a part of the substrate surface, and then with the surface part as reference position, the initial resist film thickness E (nm) was measured by using a stylus-type surface profiler.

(3) Development 2 ml of a developing solution of 2.38 mass % aqueous solution of TMAH was dropped on the surface of the antistatic film. After standing for 60 seconds, the developing solution was shaken off at 800 rpm, and the film was dried by continuing the rotation for 60 seconds.

(4) Postbaking process

The substrate was let to stand for 10 minutes in an oven heated in advance to 90° C., for drying.

(5) Resist film thickness F (nm) after development was measured with a stylus-type surface profiler, with respect to the part from which the resist had been peeled off in (2) above.

(6) Resist film thickness loss D (D=F−E) was calculated by subtracting E from F.

It is preferable that the value obtained by subtracting film thickness loss C (nm) from reference film thickness loss D (nm) be less than 10 nm, particularly preferably less than 3 nm.

Example 1

Into 100 ml of a 0.8 mass % aqueous solution of poly(5-sulfoisothianaphthene-1,3-diyl), 0.1 mass % of dodecylbenzenesulfonic acid was added and the pH was regulated to be 4.5 by using a mixed solution of basic compounds formed by 1 mol/l each of ammonia water and an aqueous solution of 1,4-diaminobutane with a ratio of 99%:1%, to thereby obtain antistatic treatment agent 1. The antistatic treatment agent 1 showed, on a glass substrate, a surface resistivity of $4.8 \times 10^6$ ohm/sq.

Example 2

Into 100 ml of a 0.8 mass % aqueous solution of poly(5-sulfoisothianaphthene-1,3-diyl), 0.1 mass % of dodecylbenzenesulfonic acid was added and the pH was regulated to be 4.5 by using a mixed solution of basic compounds formed by of 1 mol/l each ammonia water and an aqueous solution of 1,4-diaminobutane with a ratio of 90%:10%, to thereby obtain antistatic treatment agent 2. The antistatic treatment agent 2 showed, on a glass substrate, a surface resistivity of $6.4 \times 10^6$ ohm/sq.

Example 3

Into 100 ml of a 0.8 mass % aqueous solution of poly(5-sulfoisothianaphthene-1,3-diyl), 0.1 mass % of dodecylbenzenesulfonic acid was added and the pH was regulated at 4.5 by using a mixed solution of basic compounds formed by 1 mol/l each of ammonia water and an aqueous solution of 1,6-hexamethylenediamine with a ratio of 99%:1%, to thereby obtain antistatic treatment agent 3. The antistatic treatment agent 3 showed, on a glass substrate, a surface resistivity of $3.9 \times 10^6$ ohm/sq.

Example 4

Into 100 ml of a 0.8 mass % aqueous solution of poly(5-sulfoisothianaphthene-1,3-diyl), 0.1 mass % of dodecylbenzenesulfonic acid was added and the pH was regulated to be 4.5 by using a mixed solution of basic compounds formed by 1 mol/l each of ammonia water and an aqueous solution of 1,6-hexamethylenediamine with a ratio of 90%:10%, to thereby obtain antistatic treatment agent 4. The antistatic treatment agent 4 showed, on a glass substrate, a surface resistivity of $5.1 \times 10^6$ ohm/sq.

Comparative Example 1

Into 100 ml of a 0.8 mass % aqueous solution of poly(5-sulfoisothianaphthene-1,3-diyl), 0.1 mass % of dodecylbenzenesulfonic acid was added and the pH was regulated to be 4.5 by using a 1 mol/l aqueous solution of ammonia, to thereby obtain antistatic treatment agent 5. The antistatic treatment agent 5 showed, on a glass substrate, a surface resistivity of $3.3 \times 10^6$ ohm/sq.

Comparative Example 2

Into 100 ml of a 0.8 mass % aqueous solution of poly(5-sulfoisothianaphthene-1,3-diyl), 0.1 mass % of dodecylbenzenesulfonic acid was added and the pH was regulated to be 4.5 by using a mixed solution of basic compounds formed by 1 mol/l each of ammonia water and an aqueous solution of ethanolamine with a ratio of 50%:50%, to thereby obtain antistatic treatment agent 6. The antistatic treatment agent 6 showed, on a glass substrate, a surface resistivity of $4.3 \times 10^6$ ohm/sq.

Results of measurements of a film thickness loss on the antistatic treatment agents of examples 1 to 4 and comparative examples 1 and 2 are shown in Table 1.

TABLE 1

| | Composition of neutralizing agent (mol. ratio) | | | | film thickness loss (nm) |
|---|---|---|---|---|---|
| Example 1 | NH₃ | 99% | DAB | 1% | 1 |
| Example 2 | | 90% | | 10% | 3 |
| Example 3 | | 99% | HMDA | 1% | 2 |
| Example 4 | | 90% | | 10% | −1 |
| Comp. Ex. 1 | | 100% | — | — | 7 |
| Comp. Ex. 2 | | 50% | EA | 50% | 10 |

* NH₃: ammonia water (manufactured by Kanto Chemical Co., Inc.)
DAB: 1,4-diaminobutane (manufactured by Acros Organics)
HMDA: hexamethylenediamine (manufactured by Kanto Chemical Co., Inc.)
EA: ethanolamine (manufactured by Kanto Chemical Co., Inc.)

As shown in Table 1, it was confirmed that the antistatic treatment agents containing the diamine (divalent) or polyamine (polyvalent) aliphatic basic compound (Examples 1 to 4) showed almost no film thickness loss, but the antistatic treatment agents utilizing other basic compounds (Comparative Examples 1 and 2) showed film thickness losses.

Examples 5 to 14

Into 100 ml of a 0.8 mass % aqueous solution of poly(5-sulfoisothianaphthene-1,3-diyl), 0.1 mass % of dodecylbenzenesulfonic acid was added and the pH was regulated to be 4.5 by using a mixed solution of basic compounds formed by 1 mol/l each of ammonia water and diamine (divalent) or polyamine (polyvalent) basic compounds with a molar ratio shown in Table 2, to thereby obtain antistatic treatment agents.

Results of measurement of contact angle of the antistatic treatment agents are shown in Table 2.

TABLE 2

| | neutralizing agent composition (mol. ratio) | | | | contact angle (°) |
|---|---|---|---|---|---|
| Example 3 | NH₃ | 99% | HMDA | 1% | 29.8 |
| Example 5 | | 95% | | 5% | 22.5 |
| Example 4 | | 90% | | 10% | 16.3 |
| Example 6 | | 80% | | 20% | 14.8 |
| Example 1 | | 99% | DAB | 1% | 31.4 |
| Example 7 | | 95% | | 5% | 26.5 |
| Example 2 | | 90% | | 10% | 22.0 |
| Example 8 | | 80% | | 20% | 17.0 |
| Example 9 | | 95% | DAPe | 5% | 19.7 |
| Example 10 | | 90% | | 10% | 16.0 |
| Example 11 | | 95% | DADPA | 5% | 24.1 |
| Example 12 | | 90% | | 10% | 20.1 |
| Example 13 | | 95% | DAPr | 5% | 29.0 |
| Example 14 | | 90% | | 10% | 24.9 |
| Comp. Ex. 1 | | 100% | — | — | 33.4 |
| Comp. Ex. 2 | | 50% | EA | 50% | 34.6 |

* NH₃: ammonia water (manufactured by Kanto Chemical Co., Inc.)
HMDA: hexamethylenediamine (manufactured by Kanto Chemical Co., Inc.)
DAB: 1,4-diaminobutane (manufactured by Acros Organics)
DAPe: 1,3-diaminopentane (manufactured by Tokyo Kasei Kogyo Co., Ltd.)
DADPA: 3,3'-diaminodipropylamine (manufactured by Acros Organics)
DAPr: 1,3-diaminopropane (manufactured by Kanto Chemical Co., Inc)
EA: ethanolamine (manufactured by Kanto Chemical Co., Inc.)

Examples 15 to 17

To 100 mL of aqueous solution, dodecylbenzenesulfonic acid was added in the blending amount as described in Table 3. Then by adding thereto a mixed solution of the basic compound where 1 mol/L each of ammonia water and an aqueous solution of 1,4-diaminobutane were mixed with the blending ratio of 80%:20%, a water-soluble composition having a pH value of 4.5 was obtained. The contact angle of the water-soluble composition for each of the Examples is shown in Table 3.

Comparative Examples 3 to 5

To 100 mL of water, dodecylbenzenesulfonic acid was added the blending amount as described in Table 3. Then, by adding thereto 1 mol/L of an aqueous solution of ammonia, a water-soluble composition having a pH value of 4.5 was obtained. The contact angle of the water-soluble composition in each of the Comparative Examples is shown in Table 3.

TABLE 3

| | Neutralizing agent composition (mol ratio) | | Additive | Contact angle |
|---|---|---|---|---|
| | NH₃ | DAB | (ppm) | (degree) |
| Example 15 | 80% | 20% | 2000 | 18.1 |
| Example 16 | 80% | 20% | 1000 | 21.1 |
| Example 17 | 80% | 20% | 500 | 22.5 |
| Comparative Example 3 | 100% | — | 2000 | 41.5 |
| Comparative Example 4 | 100% | — | 1000 | 38.7 |
| Comparative Example 5 | 100% | — | 500 | 38.9 |

* NH₃: 1N-ammonia water (manufactured by kanto Chemical Co., Inc.)
DAB: 1,4-diaminobutane (manufactured by ACROS ORGANICS)

As seen from the results shown in Table 3, the water-soluble compositions of the present invention (Examples 15 to 17) are excellent in wettability compared with the water-soluble compositions of Comparative Examples (Comparative Examples 3 to 5).

Examples 18 to 24

To 100 mL of aqueous solution, n-dodecylbenzenesulfonic acid (manufactured by kanto Chemical Co., Inc.) was added to be 2000 ppm. Then, by using a mixed solution of a basic compound where the components were mixed in 1 mol/L each with the blending ratio as shown in Table 4, a water-soluble composition having a pH value of 4.5 for each of Examples 18 to 24 was obtained. The contact angle of each of the water-soluble compositions against a FEP171 resist film is shown in Table 4.

Comparative Examples 6 and 7

To 100 mL of water, n-dodecylbenzenesulfonic acid (manufactured by kanto KAGAKU) was added to be 2000 ppm. Then, a mixed solution of 1 mol/L each of ammonia water (1N-ammonia water manufactured by kanto Chemical, Inc.) and ethanolamine with the ratio as shown in Table 4 was further added thereto to obtain a water-soluble composition having a pH value of 4.5 for each of Comparative Examples 6 and 7. The contact angle of each of the water-soluble compositions of Comparative Examples 6 and 7 against a FEP171 resist film is shown in Table 4.

TABLE 4

| | Neutralizing agent composition (mol ratio) | | | | Additive (ppm) | Contact angle (degree) |
|---|---|---|---|---|---|---|
| Example 15 | NH$_3$ | 80% | DAB | 20% | 2000 | 18.1 |
| Example 18 | | 95% | | 5% | 2000 | 32.4 |
| Example 19 | | 95% | DAPr | 5% | 2000 | 36.2 |
| Example 20 | | 80% | | 20% | 2000 | 28.0 |
| Example 21 | | 95% | HMDA | 5% | 2000 | 34.7 |
| Example 22 | | 80% | | 20% | 2000 | 26.7 |
| Example 23 | | 95% | DAPe | 5% | 2000 | 34.7 |
| Example 24 | | 80% | | 20% | 2000 | 24.5 |
| Comparative Example 3 | | 100% | — | — | 2000 | 41.5 |
| Comparative Example 6 | | 95% | EA | 5% | 2000 | 38.0 |
| Comparative Example 7 | | 80% | | 20% | 2000 | 38.0 |

* NH$_3$: 1N-ammonia water (manufactured by kanto CHEMICAL, INC.)
DAB: 1,4-diaminobutane (manufactured by ACROS ORGANICS)
HMDA: hexamethylenediamine (manufactured by kanto CHEMICAL, INC.)
EA: ethanolamine (manufactured by kanto CHEMICAL, INC.)

It was confirmed that the contact angle against a FEP171 resist film decreased by adding a diamine (divalent) or polyamine (polyvalent) aliphatic basic compound to the anionic surfactant in Examples 18 to 24, unlike in Comparative Examples 6 and 7.

The invention claimed is:

1. A method of performing photolithography, comprising:
a step of forming an antistatic film by applying an antistatic treatment agent comprising (a) an aqueous solvent-soluble electroconductive polymer having a Brönsted acid group, (b) a diamine or polyamine aliphatic basic compound and (c) a volatile basic compound onto a resist sensitive to a charged-particle-beam, and
a step of drawing patterns by radiating a charged-particle-beam onto the resist having applied thereon the antistatic treatment agent,
wherein the molar ratio of diamine or polyamine aliphatic basic compound in the total mole number of all basic compounds present is within a range of 0.1 to 75 mol %, and the number of moles of the basic group contained in the diamine or polyamine aliphatic basic compound is within a range of 0.05 to 50 mol % based on the number of moles of the Brönsted acid group contained in the aqueous solvent-soluble electroconductive polymer, and
wherein the diamine or polyamine aliphatic basic compound consists of one or more kinds selected from the group consisting of diaminoalkane, triaminoalkane, polyaminoalkane and polyalkylimine.

2. The method according to claim 1, wherein at least one kind of the diamine or polyamine aliphatic basic compounds has a boiling point of 80° C. or higher.

3. The method according to claim 1, wherein the diamine or polyamine aliphatic basic compound consists of one or more kinds selected from the group consisting of ethylenediamine, diaminopropane, diaminobutane, diaminopentane, diaminohexane, diaminooctane, diaminodecane and polyethyleneimine.

4. The method according to claim 1, wherein the aqueous solvent-soluble electroconductive polymer is a π-conjugated electroconductive polymer.

5. The method according to claim 1, wherein the Brönsted acid group is a sulfonic acid group.

6. The method according to claim 1, wherein the antistatic treatment agent is an aqueous solution containing 0.1 to 10 mass % of an aqueous solvent-soluble electroconductive polymer, 0.1 to 20 mass % of a diamine or polyamine aliphatic basic compound and 0.1 to 20 mass % of a volatile basic compound, provided that the entire amount of the antistatic treatment agent is 100 mass %.

7. The method according to claim 1, wherein the antistatic treatment agent further comprises a surfactant.

8. The method according to claim 7, wherein the surfactant is an anionic surfactant, an amphoteric surfactant or a mixture thereof.

9. The method according to claim 7, wherein the surfactant is an anionic surfactant.

10. The method according to claim 9, wherein the antistatic treatment agent is an aqueous solution containing 0.1 to 10 mass % of an aqueous solvent-soluble electroconductive polymer, 0.1 to 20 mass % of a diamine or polyamine aliphatic basic compound, 0.1 to 20 mass % of a volatile basic compound and 0.001 to 1 mass % of an amphoteric surfactant provided that the entire amount of the antistatic treatment agent is 100 mass %.

11. The method according to claim 1, wherein the aqueous solvent-soluble electroconductive polymer includes a chemical structure represented by formula (1):

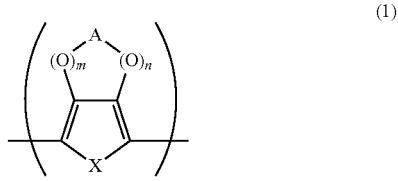

(1)

in the formula, m and n each independently represents 0 or 1; X represents S, N—R$^1$ or O; A represents an alkylene group or an alkenylene group or that may have two more double bonds having 1 to 4 carbon atoms and having at least a substituent represented by —B—SO$_3^-$M$^+$, wherein the alkylene and alkenylene group may be substituted with a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group or a substituted phenyl group; B represents —(CH$_2$)$_p$—(O)$_q$—(CH$_2$)$_r$— in which p, q and r independently represents 0 or an integer of 1 to 3; and M$^+$ represents a hydrogen ion, an alkali metal ion, or a quaternary ammonium ion.

12. The method according to claim 1, wherein the aqueous solvent-soluble electroconductive polymer includes a chemical structure represented by formula (2):

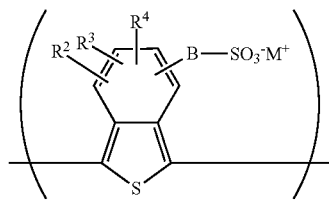

(2)

in the formula, R$^2$ to R$^4$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —B—SO$_3^-$M$^+$ group; B represents —(CH$_2$)$_p$—(O)$_q$—(CH$_2$)$_r$— in which p, q and r independently represents 0 or an integer of 1 to 3; and M$^+$ represents a hydrogen ion, an alkali metal ion, or a quaternary ammonium ion, and,
  (b) a volatile basic compound selected from the group consisting of ammonia, methylamine, ethylamine and dimethylamine.

13. The method according to claim 12, wherein the aqueous solvent-soluble electroconductive polymer is a polymer including 5-sulfonisothianaphthene-1,3-diyl as a chemical structure.

14. The method according to claim 1, wherein the aqueous solvent-soluble electroconductive polymer includes a chemical structure represented by formula (3):

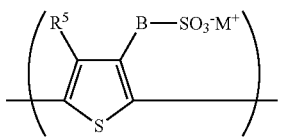

(3)

in the formula, R$^5$ represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —B—SO$_3^-$M$^+$ group; B represents —(CH$_2$)$_p$—(O)$_q$—(CH$_2$)$_r$— in which p, q and r independently represents 0 or an integer of 1 to 3; and M$^+$ represents a hydrogen ion, an alkali metal ion, or a quaternary ammonium ion.

15. The method according to claim 1, wherein the aqueous solvent-soluble electroconductive polymer includes a chemical structure represented by formula (4):

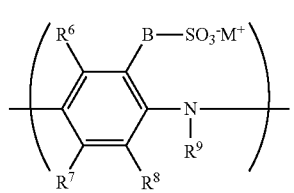

(4)

in the formula, R$^6$ to R$^8$ each independently represents a hydrogen atom, a linear or branched, saturated or unsaturated hydrocarbon group having 1 to 20 carbon atoms, a linear or branched, saturated or unsaturated alkoxy group having 1 to 20 carbon atoms, a hydroxyl group, a halogen atom, a nitro group, a cyano group, a trihalomethyl group, a phenyl group, a substituted phenyl group or a —SO$_3^-$M$^+$ group; R$^9$ represents a hydrogen atom or a monovalent group selected from a group of linear or branched, saturated or unsaturated hydrocarbon group having 1 to 20 carbon atoms, a phenyl group and a substituted phenyl group; B represents —(CH$_2$)$_p$—(O)$_q$—(CH$_2$)$_r$— in which p, q and r independently represents 0 or an integer of 1 to 3; and M$^+$ represents a hydrogen ion, an alkali metal ion, or a quaternary ammonium ion.

16. The method according to claim 1, wherein the volatile basic compound is selected from the group consisting of ammonia, methylamine, ethylamine and dimethylamine.

* * * * *